United States Patent [19]

Yabu

[11] Patent Number: 4,662,753
[45] Date of Patent: May 5, 1987

[54] APPARATUS AND METHOD FOR ALIGNING OBJECTS

[75] Inventor: Shuichi Yabu, Kawasaki, Japan

[73] Assignee: Canon Kabushiki Kaisha, Tokyo, Japan

[21] Appl. No.: 697,461

[22] Filed: Feb. 1, 1985

[30] Foreign Application Priority Data

Feb. 6, 1984 [JP] Japan .................................. 59-18201

[51] Int. Cl.⁴ ............................................ G01B 11/00
[52] U.S. Cl. ..................................... 356/401; 250/548
[58] Field of Search ................ 250/548; 356/399, 400, 356/401

[56] References Cited

U.S. PATENT DOCUMENTS

| | | | |
|---|---|---|---|
| 4,052,603 | 10/1977 | Karlson | 356/400 |
| 4,167,677 | 9/1979 | Suzki | 250/548 |
| 4,266,876 | 5/1981 | Nakazawa et al. | 356/400 |
| 4,408,885 | 10/1983 | Johannsmeier et al. | 356/401 |
| 4,538,914 | 9/1985 | Yomoda et al. | 356/401 |
| 4,563,094 | 1/1986 | Yamada | 356/401 |

Primary Examiner—F. L. Evans
Attorney, Agent, or Firm—Fitzpatrick, Cella, Harper & Scinto

[57] ABSTRACT

An alignment apparatus for aligning two objects each having an alignment mark, includes a sensor for determining positional deviation between the two objects at the position of the alignment mark; and a processor for providing positional deviation between the two objects at a position other than the position of the mark where the sensor detects the positional deviation.

6 Claims, 10 Drawing Figures

4,662,753

APPARATUS AND METHOD FOR ALIGNING OBJECTS

BACKGROUND OF THE INVENTION

The present invention relates in a general way to an apparatus and method for aligning objects, and more particularly, for relatively aligning two objects.

Generally, in a semiconductor circuit manufacturing apparatus for manufacturing semiconductor devices, such as IC (Integrated Circuit) and LSI (Large-Scale Integrated Circuit), a mask and a wafer have to be aligned with each other prior to the wafer being exposed to the pattern formed in the mask.

FIG. 1 illustrates a prior art device for such an alignment operation, wherein measuring means 3L and 3R is provided to detect the relative deviation between the alignment marks LW and RW formed on the wafer 1 and the alignment marks LM and RM formed on the mask 2, respectively. If the deviations ($\Delta$XL, $\Delta$YL), ($\Delta$XR, $\Delta$YR) are within a predetermined tolerance, the alignment is deemed to have been accomplished. If, on the other hand, the deviation is larger than the tolerance, the wafer 1 and/or the mask 2 is shifted until the deviation falls within the tolerance.

For the purpose of increasing the accuracy of the alignment, a smaller tolerance is desirable, which, however, will require longer time to accomplish the tolerable alignment, since there can be an error in the correcting movement or shifting of the wafer stage or mask stage carrying the wafer 1 or mask 2, or in the measurement of the deviation between the wafer 1 and the mask 2. Accordingly, in order to achieve both alignment accuracy alignment speed, it is necessary to determine a proper tolerance corresponding to the desired alignment accuracy and alignment speed.

Here, it should be noted that "$\Delta$XL" and "$\Delta$YL" are the deviations between the left mark LM of the mask 2 and the left mark LW of the wafer 1, in X-direction and Y-direction, respectively. Similarly, "$\Delta$XR" and "$\Delta$YR" are the deviations between the right mark RM of the mask 2 and the right mark RW of the wafer 1, in X-direction and Y-direction, respectively.

Referring to FIGS. 2-5, the tolerance T employed in the prior art devices will be explained.

In the example shown in FIG. 2, the tolerance is defined by $|\Delta XL| \leq T$, $|\Delta YL| \leq T$, $|\Delta XR| \leq T$ and $|\Delta YR| \leq T$, that is, the tolerance is defined by a regular square, as shown in the Figure.

FIGS. 5A and 5B illustrate states of a positional deviation between a pattern area 2A of the mask 2 and an area 1A of the wafer 1 to be exposed to the pattern. The area 1A of the wafer 1 corresponds to the entire surface of the wafer 1 in the case of a global alignment, while it corresponds to an area covered by a one shot exposure in the case of a divided exposing system, for example, as in a stepper.

The centers of the mask pattern area 2A and the wafer exposure area 1A are indicated by reference OM and OW; corners of the pattern area 2A and the exposure area 1A are designated by reference CM and CW; and the lengths of the edges of the pattern area 2A and the exposure area 1A are 2a and 2b, as shown in FIGS. 5A and 5B.

FIG. 5A indicates the relative position where there is no rotational deviation between the pattern area 2A and the exposure area 1A. If the deviation ($\Delta$XL, $\Delta$YL) is equal to (T, T), and ($\Delta$XR, $\Delta$YR) is equal to (T, T), the deviation between the pattern area 2A and the exposure area 1A, ($\Delta$X, $\Delta$Y) is (T, T) at any point in the pattern area 2A, because of no rotational deviation therebetween. If, however, there is rotational deviation between the pattern area 2A and the exposure area 1A, the maximum deviation occurs between the corner CM of the mask 2, and the corresponding corner CW of the wafer 1. The positional deviation, ($\Delta$XC, $\Delta$YC), between the point CM on the pattern area 2A and the point CM of the exposure area 1A is such that $\Delta$XC$\geq$2T, and $\Delta$YC=T, when ($\Delta$XL, $\Delta$YL)=(T, −T); ($\Delta$XR, $\Delta$YR)=(T, T); and a =b. Therefore, the deviation does not satisfy the tolerance T at the point CW on the exposure area 1A.

In order to limit the deviation within the tolerance at the marginal areas of the pattern without changing the shape of the tolerance area (FIG. 2), the edges of the tolerance area of a rectangular shape as shown in FIG. 3 have to be T/2 in length, with the result that the area of the tolerance is reduced from $4T^2$ to $T^2$. This will necessarily increase the time required for accomplishing the alignment.

FIG. 4 shows another example of the conventional tolerance area. In this example, the tolerance area is defined such that the deviations, ($\Delta$XL, $\Delta$YL) and ($\Delta$XR, $\Delta$YR) are within the tolerance when the following linear inequalities are satisfied:

$$|\Delta XL| + |\Delta YL| \leq T$$

$$|\Delta XR| + |\Delta YR| \leq T$$

Because of these inequalities of the first degree between $\Delta X$ and $\Delta Y$, an alignment error at the marginal portions of the pattern area 2A in X-direction can be avoided even when there is a rotational deviation between the mask 2 and the wafer 1. In this case, if a=b is satisfied in FIG. 5, any point on the pattern area 2A satisfies the positional deviation $|\Delta X| \leq T$ and $|\Delta Y| \leq T$, when the tolerance defined by FIG. 4 is satisfied. The tolerance area defined as shown in FIG. 4 is $2T^2$, and therefore, is twice as large as the tolerance area of FIG. 3, which will save the time required for the alignment. However, when the deviation is such that $\Delta XL=2T/3$, $\Delta YL=2T/3$, $\Delta XR=2T/3$, $\Delta YR=2T/3$, without rotational deviation, the deviation is less than the tolerance T at any point on the pattern area 2A, but this is rejected by either the tolerance defined by FIG. 3 or the tolerance defined by FIG. 4, with the result that an additional alignment operation is required. This means that an unnecessary alignment operation is required, and therefore, the alignment operation is made longer than necessary.

As described above, when it is desired that the positional deviations are within the tolerance of $|\Delta X| \leq T$ and $|\Delta Y| \leq T$ at any point on the pattern area 2A, the tolerance defined by FIG. 2 may cause a deviation over the tolerance at marginal areas of the pattern area 2A, while the tolerance defined by FIG. 3 or FIG. 4 can increase the alignment precision at the marginal areas of the pattern area, but it will require a longer alignment operation. That is, the tolerance of FIG. 2 will result in a lower yield, and the latter will result in a lower throughput.

SUMMARY OF THE INVENTION

Accordingly, it is a primary object of the present invention to provide an apparatus and a method wherein an optimum tolerance is set in response to a desired alignment accuracy so as to permit an alignment operation with minimum required time.

This and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
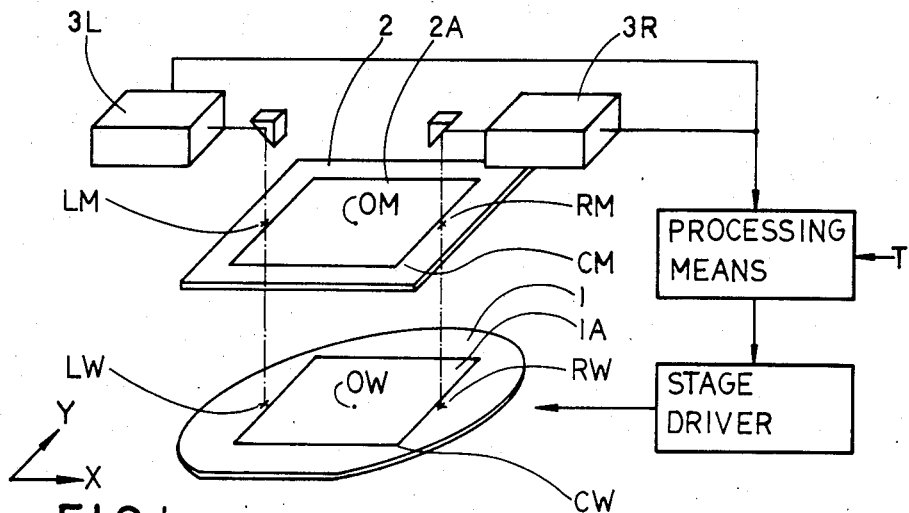
FIG. 1 is a schematic view of a prior art alignment apparatus.
Figure 2:
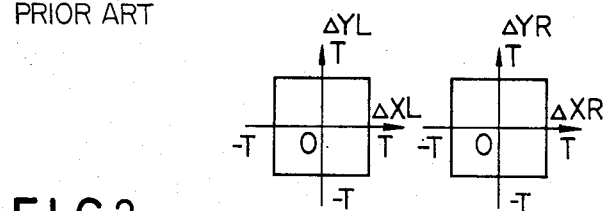
FIGS. 2-4 illustrate examples of conventional tolerances.
Figure 3:
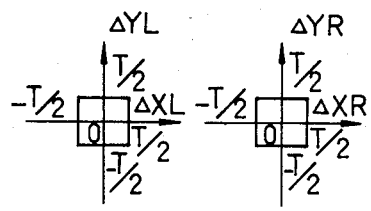
Figure 6:
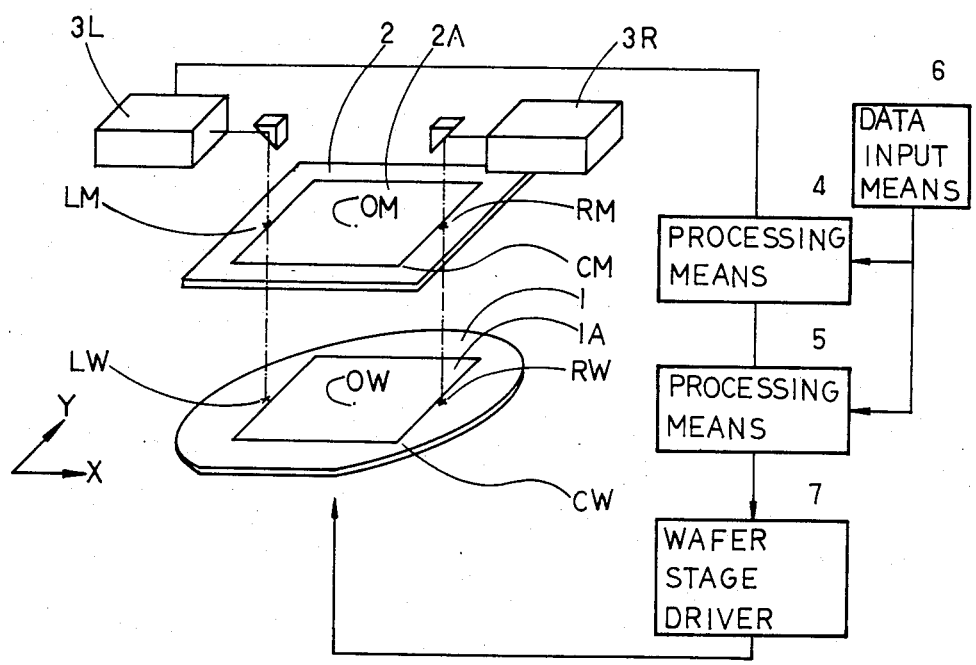
FIG. 6 is a somewhat schematic view of an apparatus according to an embodiment of the present invention.
Figure 7:
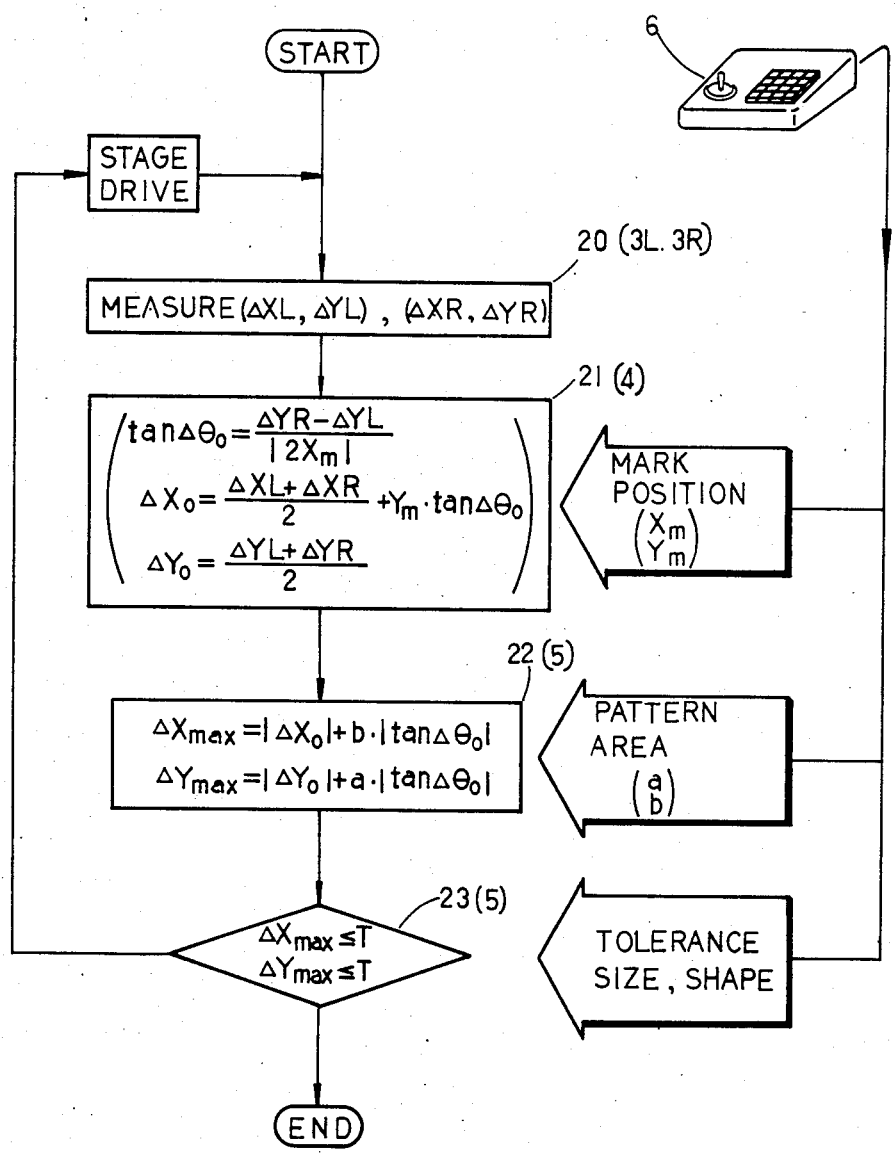
FIG. 7 is a flowchart illustrating the process of alignment in the apparatus shown in FIG. 6.

Referring now to FIG. 6, there is shown a somewhat schematic view of an alignment apparatus according to an embodiment of the present invention. FIG. 7 is a flow chart showing the operation of the apparatus of FIG. 6. The same reference numerals as in FIG. 1 are assigned to the corresponding elements in FIG. 6.

As shown in FIG. 6, a wafer 1 is provided with a left side alignment mark (hereinafter simply called "mark") LW and a right side mark RW. Above the wafer 1, there is a mask 2 provided with a left side mark LM and right side mark RM, corresponding to the wafer marks LW and RW, respectively. The wafer 1 and the mask 2 are in close proximity with each other, or are positioned in optically conjugate relation with respect to a projection optical system not shown. The references OW and OM are the centers of the area 1A of the wafer 1 to be exposed and the pattern area 2A of the mask 2; and CM and CW are respective one of the corners of the pattern area 2A and the exposure area 1A. The wafer 1 is fixedly supported by, for example, a vacuum chuck on a stage mechanism which is movable in X-direction and Y-direction by a wafer stage driving mechanism 7.

Deviation measuring means 3L and 3R are disposed above the mask 2 to determine the deviations between the marks LM and RM of the mask 2 and the marks LW and RW of the wafer 1, respectively. The outputs of the deviation measuring means 3L and 3R are transmitted to a first processing means or circuit 4 and then to second processing means or circuit 5. A data input means 6 is effective to transmit the desired position information from the pattern area 2A and the exposure area 1A to the first processing means 4. Further, the data input means 6 is adapted to receive the size and the configuration of a tolerance area for the positional deviation between the mask 2 and the wafer 1 and to receive the size ($2a \times 2b$) of the pattern area 2A and the exposure area 1A. The data in this respect are transmitted to the second processing means 5.

The operation of the apparatus will now be described in conjunction with FIGS. 7-9.

As shown in the flow chart of FIG. 7, at the beginning, the positional deviation, ($\Delta XL$, $\Delta YL$) and ($\Delta XR$, $\Delta YR$), is detected between the marks LM and RM of the mask 2 and the corresponding marks LW and RW of the wafer 1, respectively by the deviation measuring means 3L and 3R (FIG. 6). This is the step 20 in the FIG. 7.

At the second step, that is, step 21, the first processing circuit 4 calculates the positional deviation ($\Delta X_O$, $\Delta Y_O$), between the center OM of the pattern area 2A and the center OW of the exposure area 1A of the wafer 1 and calculates a rotational deviation $\Delta\theta_O$ between the pattern area 2A and the exposure area 1A.

Figure 8:
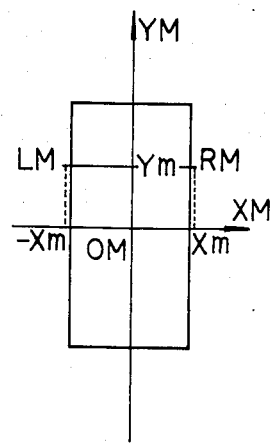
FIG. 8 is a plan view showing the position where the deviation is detected.
Figure 9:
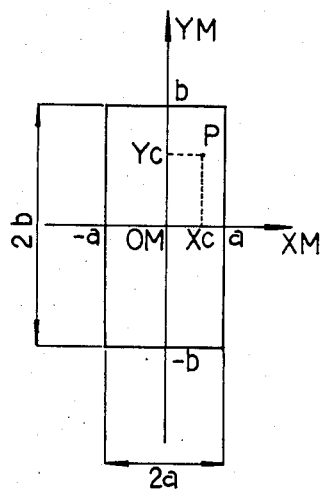
FIG. 9 is a plan view around a given point on a pattern area of a mask.

As shown in FIG. 8, the central deviations $\Delta X_O$ and $\Delta Y_O$, and the rotational deviation are calculated by the following equations:

$$\tan \Delta\theta_O = (\Delta YR - \Delta YL)/|2Xm| \tag{1}$$

$$\Delta X_O = (\Delta XL + \Delta XR)/2 + Ym \cdot \tan \Delta\theta_O \tag{2}$$

$$\Delta Y_O = (\Delta YL + \Delta YR)/2 \tag{3}$$

where the coordinate positions of the marks LM and RM on the mask coordinate OM-XM-YM are ($-Xm$, $Ym$) and ($Xm$, $Ym$), respectively.

The data of the mark positions ($Xm$, $Ym$) are given by the data input means 6.

At the third step, i.e., a step 22, the second processing means 5 calculates the maximum deviations $\Delta Xmax$ and $\Delta Ymax$, which are the maximum deviations in the pattern area 2A. The size of the pattern area 2A is given to the second processing means 5 through the data input means 6 as a rectangular area having the edge of length a in the X-direction and the edge of length b in the Y-direction, that is, the pattern area 2A is defined by $-a \leq X \leq a$, $-b \leq Y \leq b$ in the mask coordinate. Also, the data of the tolerance for the deviation are given for the purpose of the fourth step, that is, step 23. At a given point P($XC$, $YC$) on the pattern area 2A, the deviation from the point on the exposure area 1A, to which the point P exactly corresponds, is:

$$\Delta XC = \Delta X_O - YC \tan \Delta\theta_O \tag{4}$$

$$\Delta YC = \Delta Y_O - XC \tan \Delta\theta_O \tag{5}$$

Since, $|XC| \leq a$ and $|YC| \leq b$, the maximum deviations in the pattern area are:

$$\Delta Xmax = |\Delta X_O| + b \cdot |\tan \Delta\theta_O| \tag{6} \text{ ps}$$
$$\Delta Ymax = |\Delta Y_O| + a \cdot |\tan \Delta\theta_O| \tag{7}$$

At the fourth step, that is, step 23, the second processing means 5 discriminates whether the maximum deviations $\Delta Xmax$ and $\Delta Ymax$ are within the tolerance on the basis of the following inequations:

$$\Delta Xmax \leq T \tag{8}$$

$$\Delta Ymax \leq T \tag{9}$$

When those inequations are satisfied, the proper alignment operation is deemed to have been accomplished. If not, the wafer 1 is moved by the wafer stage driving mechanism 7 to correct the deviations, and then the process goes back to the first step, that is, the step 20.

According to the above described process of alignment operation, the alignment is rejected at the fourth step (step 23) if there is at least one point in the pattern area where the deviation is beyond the tolerance, that is, $|\Delta X|>T$ or $|\Delta Y|>T$. Therefore, the alignment is complete only when the deviation is not more than the tolerance T at any point in the pattern area.

The position data (Xm, Ym) which is necessary in the calculation at the step 21, the pattern area data (a, b) necessary for the calculation at the step 22 and the tolerance data (T) necessary for the calculation at the step 23, are inputted by the data input means 6 prior to the start of the alignment routine. Therefore, the system can meet the change of the alignment mark positions, the change of the pattern area size and/or the change of the required tolerance. However, it is a possible alternative that the data input means 6 is omitted, and the data are fixed in the processing means 4 and 5, when the sizes of the mask and wafer and the positions of the marks are fixed.

In the foregoing embodiment, the wafer 1 is moved to correct the deviation, it is possible to move the mask 2 or to move both of the mask 2 and the wafer 1.

Figure 4:
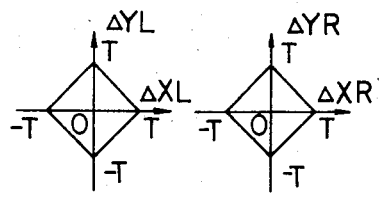
Figure 5A:
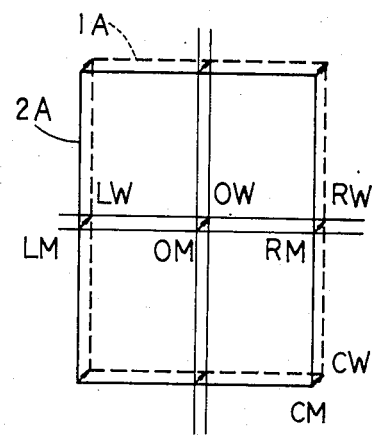
FIGS. 5A and 5B show some states of the positional deviation between the pattern area of a mask and an area of a wafer to be exposed.
Figure 5B:
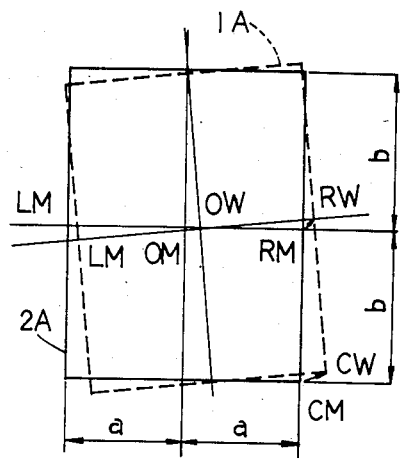

In the foregoing embodiment of FIGS. 6 and 7, the description has been made with respect to the tolerance area having a rectangular configuration, that is, $|\Delta X|\leq T$ and $|\Delta Y|\leq T$ at any point in the pattern area. However, it is not always necessary that the tolerance area be rectangular. For example, when a diamond-shape tolerance area is desired as shown in FIG. 4, the following discriminating inequalities is used at the fourth step, that is, step 23 of FIG. 7 in place of the inequalities (8) and (9):

$$\Delta Xmax + \Delta Ymax \leq T \qquad (10)$$

As another example, when a circular area of tolerance is desired at any points on the pattern area, the circle having radius T, the following discriminating inequality is used:

$$(\Delta Xmax)^2 + (\Delta Ymax)^2 \leq T^2 \qquad (11)$$

Thus, the shape and/or the size of the tolerance area can selectively be set by the data input means 6.

In the foregoing embodiment, the deviation data have been described as being obtained at two positions, ($\Delta$XL, $\Delta$YL) and ($\Delta$XR, $\Delta$YR). However, this is not limiting, and any type of measuring method are usable if both the translational deviation and the rotational deviation can be obtained between two objects.

Further, in the foregoing embodiment, the description has been made as to the method or device whereby any point in the pattern area is brought into the same tolerance, but this is not limiting in the present invention. Rather, it is possible to change the tolerance depending on the position in the pattern area, or to change the shape of the tolerance area depending on the position in the pattern area.

As has been described, according to the present invention, the alignment in the desired precision can be accomplished in the minimum time required. Further, if means is provided for setting both or one of the size and the shape of the tolerance area, the alignment operation can be accomplished in the minimum time depending on the size and/or the shape of the tolerance area.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for aligning two objects in a predetermined relationship, comprising:

measuring means for measuring a linear deviation from alignment in a first direction and in a second direction between marks located on each of the objects, and for measuring a rotational deviation from alignment between the objects at the positions of the marks on the objects, with the rotational deviation being measured about an axis perpendicular to a plane including the first direction and the second direction;

calculating means for calculating the linear deviation from alignment, in the first and second directions, between points on the objects at positions other than the positions of the marks on the objects, with the calculation being based upon the linear deviation from alignment in the first and second directions, and the rotational deviation from alignment, as measured by said measuring means; and means for causing relative movement between the objects to place them so that the linear deviation from alignment in the first and second directions between the points is within a predetermined tolerable range.

2. An apparatus according to claim 1, wherein said calculating means includes means for determining a relation between said tolerable range and the deviation from alignment in the first and second directions between the points.

3. An apparatus according to claim 2, further comprising means for setting the tolerable range in said determining means.

4. An apparatus according to claim 1, further comprising means for selectively setting the locations of the points.

5. An apparatus according to claim 4, wherein said location setting means selects the positions of the points on the objects where maximum deviation occurs when said measuring means measures deviation.

6. A method of aligning two objects in a predetermined relationship, comprising:

measuring a linear deviation from alignment in a first direction in a second direction between marks provided on the objects, and measuring at the positions of the marks a rotational deviation from alignment between the objects about an axis perpendicular to a plane including the first direction and the second direction;

calculating the linear deviation from alignment, in the first direction and in the second direction, between point on the objects at positions other than the positions of the marks on the objects, with the calculation being based upon the linear deviation in the first and second directions and the rotational deviation measured in said measuring step;

determining the relation between a predetermined tolerable range of linear deviation from alignment and the deviation in the first and second directions between the points; and causing relative movement between the objects in response to the relation determined in said determining step.

* * * * *